May 24, 1955 R. THEDIECK 2,709,232

CONTROLLABLE ELECTRICALLY UNSYMMETRICALLY CONDUCTIVE DEVICE

Filed July 29, 1953 2 Sheets-Sheet 1

Inventor:
REINER THEDIECK
BY: [signature]

CONTROLLABLE ELECTRICALLY UNSYMMETRICALLY CONDUCTIVE DEVICE

Filed July 29, 1953

2 Sheets-Sheet 2

Inventor:
REINER THEDIECK
BY: [signature]

2,709,232

CONTROLLABLE ELECTRICALLY UNSYMMETRICALLY CONDUCTIVE DEVICE

Reiner Thedieck, Belecke (Mohne), Germany, assignor to Licentia Patent-Verwaltungs-G. m. b. H., Hohe-Bleichen, Hamburg, Germany Application July 29, 1953, Serial No. 371,013

Claims priority, application Germany July 29, 1952

20 Claims. (Cl. 317—235)

The present invention relates to electrical conductor devices, and more particularly to arrangements involving controllable electrical unsymmetrically conductive devices.

It is an object of the present invention to provide electrical conductor devices of the above type which are of improved construction.

It is a further object of the present invention to provide electrically conductive devices of the above type which are capable of varying functions for wide use in different electrical and electronic fields.

It is still another object of the present invention to provide electrical conductor devices of the above type which lend themselves to easy manufacture and which give effective and uniform results in their manufacture on a large scale.

Other objects and advantages will become apparent from the following description and the appended claims.

With the above objects in view, the present invention comprises a controllable electrically unsymmetrically conductive device comprising, in combination, a semi-conductor body composed of a surface region portion adjacent one face of the semi-conductor body and a main body portion constituting the remainder of the semi-conductor body, one of the portions being p-conductive and the other of the portions being n-conductive, a first main electrode on a face of the semi-conductor body spaced from the surface region portion of the semi-conductor body, a second main electrode on the surface region portion of the semi-conductor body, and at least two additional electrodes on the surface of the semi-conductor body located nearer to the surface region portion of the semi-conductor body than the first main electrode.

In an arrangement in accordance with the invention, there is provided a semi-conductor base member, which may be of germanium, for example, having under a surface area thereof layers which may be p- or n-conductive and which have conductivity characteristics opposite to those of the adjacent portions of the semi-conductor body, resulting, for example, from thermal treatment thereof, and an electrode which is substantially free of blocking layers arranged on the transformed zone constituted by the above-mentioned layers, the latter electrode being hereinafter termed a main electrode. In the above arrangement, two or more additional electrodes, hereinafter designated auxiliary or control electrodes, are arranged in contact with parts of the surface of the semi-conductor body which lie outside the transformed zone, these latter electrodes lying closer to the transformed zone than a carrier electrode which is preferably arranged on the opposite surface of the semi-conductor body. The carrier electrode is also referred to in the claims as a main electrode, as distinguished from the aforementioned auxiliary and control electrodes.

The thickness of the individual transformed layers or the total thickness of the assembly of layers is suitably so chosen that it is smaller than the extent of the semi-conductor body along the same direction.

The arrangement of the electrodes is advantageously so made that the electrodes other than the carrier electrode, i. e., the main, auxiliary, and control electrodes, lie on the same geometrical surface of the semi-conductor body, while particular results can be afforded by attaching them to a surface of the semi-conductor body different from that on which the carrier electrode is mounted, preferably on the surface which lies diametrically opposite the carrier electrode. Under certain circumstances, it is of advantage for all electrodes to be arranged on one and the same surface of the semi-conductor body or to arrange one or more of the auxiliary or control electrodes on a surface of the semi-conductor body lying opposite the transformed zone.

In a particular embodiment of the present invention, the transformed layer or the transformed layer zone is in the form of a hollow body which encloses the semi-conductor body over its entire length or a part thereof. In this way, the transformed layer zone and/or the semi-conductor body can be given circular, rectangular or square cross sections. The carrier electrode can be given the form of a cap or a ring while the other electrodes are ring-shaped. It has been found satisfactory to give the auxiliary and control electrodes the form of circular or cylindrical segments, while giving the transformed zone the form of a circular, square or rectangular annulus or segments of these forms.

It is particularly favorable if the auxiliary and control electrodes and the transformed zone lie in positions symmetrically arranged about a center and with respect to each other. Such systems are suitable also as controllable photoelectric electrically unsymmetrically conducting systems, while at the same time there may result an additional electrical influence by the use of the auxiliary and control electrodes. In addition it is of advantage if the spatial boundary of the transformed zone lying in a direction normal to the light incidence is made as large as possible, and if it lies as close as possible to the side of the semi-conductor crystal which is directed toward the light incidence. In this case, the carrier electrode can be made of a net or grid form.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings, in which:

Figure 1:
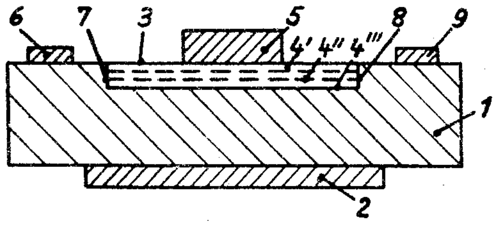
Fig. 1 shows a schematic sectional view of an embodiment of the present invention.

Referring now to the drawings, and particularly to Fig. 1, a semi-conductor body 1 is shown on which is secured a carrier electrode 2 on one surface thereof, the semi-conductor body 1 having at its opposite surface a region 3 which extends between the boundaries 7 and 8 which have been transformed in suitable manner to have light conducting characteristics which are opposite to the conductivity characteristics of the remainder of the semi-conductor body. This zone, indicated by 3, can be composed of one or more layers. In the embodiment shown in Fig. 1, this region is composed of layers 4′ to 4‴. On the thus transformed zone 3, there is mounted a main electrode 5 which is substantially free of blocking layers, while two additional electrodes 6 and 9 are arranged on the surface of the semi-conductor body 1 at a distance from the transformed zone 3 which is of the order of the thickness of this zone.

With respect to the thickness of a layer or assembly of layers constituting the transformed zone, particularly satisfactory results have been obtained where such thickness lay between $1 \times 10^{-3}$ mm. and 0.5 mm. Frequently, it is particularly favorable to provide a thickness of these layers which is between $1 \times 10^{-3}$ mm. and $50 \times 10^{-3}$ mm.

The particular distance at which the auxiliary and control electrodes are arranged from the boundary of the transformed zone is, according to the invention, so chosen that it is at least of the same order of magnitude as the total thickness of the transformed layers, preferably, however, about three times greater and, in certain cases, even more.

With respect to the minimum distance between the main electrode and the auxiliary and control electrodes, this distance is about 0.3 mm. or more. The minimum distance between the auxiliary and control electrodes with respect to each other is suitably so chosen that it is greater than twice the minimum distance between the control or auxiliary electrode and the boundary of the transformed zone which lies nearest to the particular electrode. It is of advantage to have all auxiliary and control electrodes spaced at the same minimum distance from the boundary of the transformed zone.

Figure 2:
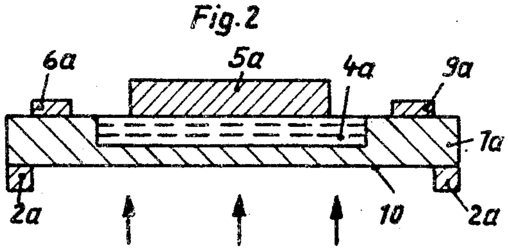
Fig. 2 is a similar view of another embodiment of the present invention, showing supplementary photoelectric control.
Figure 3:
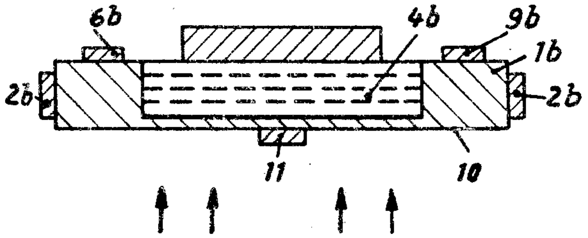
Fig. 3 is a similar view showing still another embodiment of the present invention, also showing supplementary photoelectric control.

Figs. 2 and 3 show systems having supplementary photoelectric control means. In these systems, layers *4a* and *4b* are arranged particularly deep within the semi-conductor body *1a* and *1b*, respectively, so that these layers lie as near as possible to the opposite side of the semi-conductor body. Carrier electrodes *2a* and *2b* are in the form of rings, which in the case of Fig. 2 is arranged at the bottom of the semi-conductor body, and in the case of Fig. 3 is arranged on the peripheral surface of the semi-conductor body. The incidence of light on the devices of these embodiments is indicated by arrows. The system shown in Fig. 2 shows only two electrodes *6a* and *9a*, while the Fig. 3 system is provided with an additional electrode 11 which lies opposite the transformed zone *4b* of the semi-conductor body *1b*. One of these electrodes can be used as an auxiliary electrode to influence the characteristic curve, while both of the other electrodes serve as control electrodes.

Figure 4:
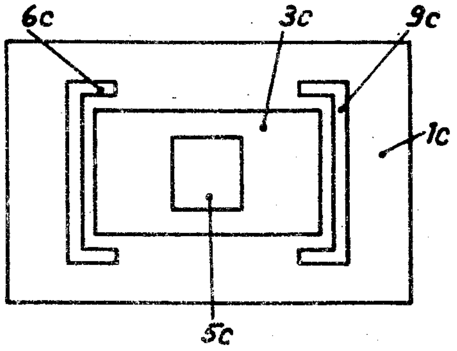
Fig. 4 is a schematic plan view of an arrangement according to the present invention.

In Fig. 4, there is shown in plan view a system arranged according to the present invention, wherein there is shown germanium block *1c* having a transformed surface region *3c* on its surface, a main electrode *5c* on the surface electrode *3c*, and auxiliary or control electrodes *6c* and *9c* spaced on the surface of block *1c* from the boundaries of region *3c*.

The operation of the embodiment thus far described can be best explained with reference to Fig. 1. The significant technical advance which is provided by the present invention will thereby become apparent.

The arrangement shown in Fig. 1 shows a layer 4′ and a layer zone 4′—4‴ arranged on the surface of an n-conductive germanium crystal lying between points 7 and 8, the layer zone 4′—4‴ being made p-conductive, and thereby the layer zone fundamentally differs from the remaining surface of the n-conductive semi-conductor crystal 1. This difference is particularly noted if two tungsten tipped probes are placed at a distance of about 0.5 mm. apart on the p-conductive surface region 3, and the resistance between the two probes is measured. The resistance will be found to be approximately 100 ohms. Besides this, the current-voltage characteristic curve measured between the point contacts has a practical ohmic character. If the point contacts are then placed at the same distance on the portion of the crystal surface which has not been transformed, there is found to be a resistance of about $10^4$ to $10^5$ ohms which does not have an ohmic character. This is due to the fact that point contacts placed on the surface of n-conductive germanium have a decided rectifying effect, so that the two probes placed on the surface act as oppositely connected rectifiers, which have a blocking resistance of the given magnitude.

An electrode 5, which is as free of blocking layers as possible, is attached to the p-conductive zone, which, according to Fig. 4, is substantially smaller than the surface 3 of the p-conductive zone, and the position of which on the p-layer can be arranged as desired. The semi-conductor body 1 is provided with a carrier electrode which is as free of blocking layers as possible, and which, if this condition is met, has no appreciable influence on the operation of the arrangement.

In this connection, it should be noted that the expressions "blocking layer free" and "free of blocking layers" as used in the specification and claims in this case are intended to refer to the fact that no barrier layer, or substantially none, exists between the electrode so referred to and the semi-conductor body to which it is connected. This is intended also to mean that either the electrode material itself contains substantially no blocking layer or that no blocking layer is formed between the electrode and the semi-conductor body as a result of the attachment of the electrode to the semi-conductor body.

In the vicinity of the boundary between the p-conductive and n-conductive regions, there is formed a physical barrier layer which consists of a negative space charge in the p-conductive part and a positive space charge in the n-conductor part. In the arrangement according to the invention, use is made of the fact that the size and position of electrode 5 on the surface of p-conductor region 3 is not critical so long as electrode 5 is made sufficiently large and free of blocking layers to transport the current to be controlled without disturbing contact resistance between electrode 5 and portion 4.

Two additional electrodes 6 and 9 are attached outside of the p-layer, these eletcrodes being arranged in contact with the surface of the semi-conductor body 1 which lies outside of the transformed zone, these electrodes lying closer to the transformed zone than does the carrier electrode 2. It has been found that the resistance of the previously described blocking layer can be changed in a particularly favorable manner with the aid of these additional electrodes 6 and 9 by having small currents flow from electrodes 6 and 9 to semi-conductor body 1 and to carrier electrode 2, the magnitude of which varies in dependence upon a given control voltage. It is also important in the arrangement according to the invention that the electrodes 6 and 9 be arranged on the surface of the n-conductive crystal outside of the p-conductive layer in the vicinity of the boundary therebetween. It is not important to which part of the boundary line of the p-conductive zone the electrodes 6 and 9 are adjacent.

The latter fact, together with the already mentioned fact that the position and size of main electrode 5 on the p-layer is not critical, afford particular advantages in the manufacture of arrangements constructed in accordance with the teaching of the present invention. There is thus made possible distances between the electrodes of such size which could not be obtained in controllable semi-conductors heretofore known.

The invention further relates to electrically unsymmetrically conducting systems of the above described type which have two or more surface zones of the surface of the semi-conductor body corresponding to the transformed layer zone previously described.

These surface zones are preferably made to have conductivity characteristics which are opposite to those of the adjacent portions of the semi-conductor body, as for example by thermal treatment of layer zones, similarly to the layer zone above described. The thus produced transformed spatial zones under the surface areas of the outer surface do not overlap and on each of the transformed zones an electrode is mounted which is substantially free of blocking layers. The thickness of the transformed layers or of the assembly of layers in the transformed zone is so chosen that it is smaller than the extent of the semi-conductor body in the same direction.

To obtain supplementary electrical control, one or more auxiliary or control electrodes may be provided outside of the transformed zones, in a manner similar to that described with respect to the previously mentioned arrangements. These supplementary electrodes lie closer to the transformed zones than does the carrier electrode, and they serve as auxiliary electrodes insofar as they are intended to influence the characteristic curve of one or more systems. In addition to this, they serve to control the currents flowing from the carrier electrode to one or more of the transformed zones and the main electrodes thereof.

The carrier electrodes can be in the form of a cap or a ring, while the other electrodes can be approximately ring-shaped. The semi-conductor body and the transformed layer zones are advantageously of circular, square, or rectangular cross section. It has been found satisfactory to arrange the auxiliary and control electrodes and/or the transformed zones symmetrically with respect to each other, while providing the same suitably with the form of circular, square or rectangular annuli or segments of these forms.

Sytems of this type are above all useful as surface-type dry rectifiers. They also operate as electrically controllable systems, for example of such type wherein one transformed zone connected in the low resistance direction serves as a control electrode, while the other transformed zone connected in the high resistance direction carries out the function of an output electrode. Also, such systems lend themselves to photoelectric control, and in such types, at least one of the spatial boundaries of the transformed zones next to the semi-conductor body and extending normal to the incidence of light rays is made as large as possible and lies as close as possible to the side of the semi-conductor crystal which faces the incidence of light. It is apparent that such systems provide for combined electrical and photoelectric control. Such control is, for example, made possible by means of supplementary electrodes which are arranged in contact with the surface of the semi-conductor body outside of the transformed zones, and which lie closer to the transformed zones than does the carrier electrode. In systems provided with photoelectric control, it is advisable to make the carrier electrode in the form of a grid.

In a particular embodiment of the present invention either the transformed layers or the transformed layer zones are in the form of hollow bodies, which enclose the semi-conductor body over part of its length.

The particular distance between the transformed zones is so chosen in accordance with the invention as to be of at least the same order as the total thickness of the layers, preferably, however, three times as large and, in some cases, even more. The same is true with respect to the shortest distance between the auxiliary and control electrodes and the boundaries of each of the transformed zones.

With respect to the particular minimum distance between each main electrode on the one side and each of the auxiliary and control electrodes on the other side, this is about 0.3 mm. or more. The minimum distance between the zones is advantageously selected to be greater than twice the minimum distance of a transformed zone from an auxiliary or control electrode. The same holds true for the minimum distance between the auxiliary and control electrodes. Suitably, the transformed zones are at the same minimum distance from the auxiliary and control electrodes.

For particular purposes it is advantageous to arrange one or more auxiliary or control electrodes opposite one of the transformed zones.

As material for the semi-conductor body, a crystal of electrically semi-conductive substance is preferable in accordance with the invention, and in particular an n-conductive germanium crystal is useful, the germanium crystal having on its outer surface several relatively large p-conductive zones. In accordance with the invention, these zones can be composed of overlapping zonal portions. This can be obtained by first heating the adjacent zones of the surfaces to be transformed for a short time and thereafter subjecting them to rapid cooling, so that the transformed zonal portions overlap. It is of advantage to provide for such short heating by current impulses with the use of an electrode of small surface in combination with a second electrode of larger surface. The current impulses can be of alternating current impulse form of any desired frequency or can be provided by a condenser discharge or a direct current impulse of desired direction. Other methods for carrying out the short heating step may include that of passing an electric arc over the surface of the semi-conductor. Particularly favorable results in this method are obtained if the electric arc is used in an atmosphere of inert or other protective gas, as for example hydrogen or helium.

In a preferred embodiment according to the invention, the surface of the zones to be transformed is subjected to a charge carrier beam, as for example an electron beam. It is also possible to pass a charge carrier spot (electron spot) over the zone to be transformed. In this way a zone can be transformed in one operating step if the cross section of the charge carrier spot and the ray energy are suitably chosen. This process can be carried out continuously or intermittently. In the latter case, the transformation of the zonal portions takes place consecutively, as was described above in the case of transformation in the use of a passage of current.

With respect to the field of utility for systems constructed according to the teaching of the invention, such systems are of particular use in the relay field, especially being suitable for use as relays or key relays. Systems according to the present invention may be used for miscellaneous purposes. Generally, the present systems lend themselves for use as control devices in which their particular advantages are especially noteworthy. In such systems two or more operations can be controlled with the aid of one system even by means of different control factors. The low ohmic input of these systems and their high resolving capacity make them particularly suitable for impulse control. By virtue of the different output impedance of the system which may be chosen as desired, these systems are particularly well suited for use in power amplification.

If oscillations are produced, for example, with the aid of a branch system, high frequency voltage can be taken up from the entire system with the aid of a second branch system.

It is possible by suitably selecting and positioning the auxiliary and control electrodes to control two zones with one or several different impulses or to operate both of these zones entirely independently of one another, in a manner corresponding to a vacuum compound tube. The control can generally be carried out with direct and alternating current, so that the systems are suitable for use for almost all types of transmitters.

It is also to be noted that the question as to which electrodes to use as control electrodes and which as auxiliary electrodes can be determined under any given circumstances. Under certain conditions, the auxiliary electrodes can be charged with constant direct current to influence the characteristic curve, while the control electrodes can be charged with direct current of desired direction or alternating current of desired frequency.

With respect to the remaining figures shown in the drawing, Figs. 5–8 show embodiments of the present device of the type above described which include at least two transformed zones.

Figure 5:
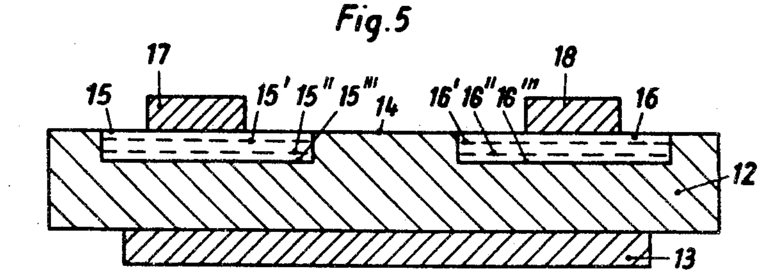
Fig. 5 is a schematic cross sectional view of another embodiment of the present invention.

In Fig. 5, there is shown germanium block 12 which is in contact with a carrier electrode 13 which is substantially free of blocking layers. Germanium block 12 has on its surface 14 two zones 15 and 16 which are composed in their depth of several overlying layers 15′—15‴ and 16′—16‴ respectively, the conductivity characteristics of these zones being opposite to the conductivity characteristics of the germanium block 12. On each of the transformed zones 15 and 16 main electrodes 17 and 18, respectively, are mounted. Both of the transformed zones 15 and 16 may be used separately or together as surface-type dry rectifiers. However, these transformed zones may also be connected as an electrically controllable system, if, for example, zone 15 is connected in series in the low resistance direction as a control member, while zone 16 is connected in the high resistance direction as an output member.

Figure 6:
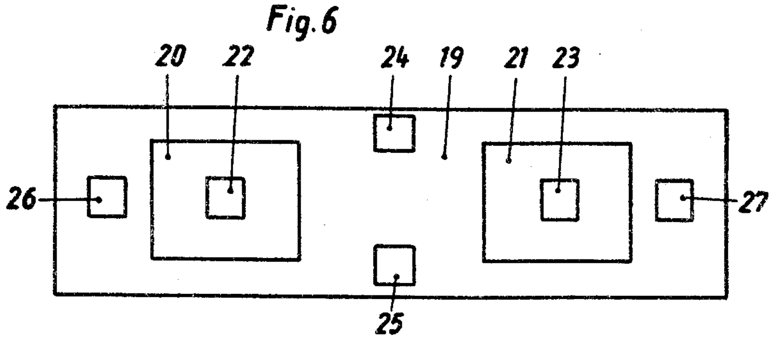
Fig. 6 is a schematic plan view of a still further form of the present invention.

Fig. 6 is a plan view of a different system, wherein germanium block 19 has two transformed zones 20 and 21, on which main electrodes 22 and 23, respectively, are mounted. Auxiliary and control electrodes 24, 25, 26 and 27 are shown mounted on the surface of germanium block 19 outside of the transformed zones thereof. In this system, one can at will control together the currents flowing through zones 20 and 21 by means of electrodes 24 and/or 25, or by means of electrodes 26 and 27, one can control zone 20 or 21 independently of the other. In the first case, electrodes 26 and/or 27 can take over the function of an auxiliary electrode to influence the characteristic curve, and electrodes 24 and/or 25 can do the same in the second case.

Figure 7:
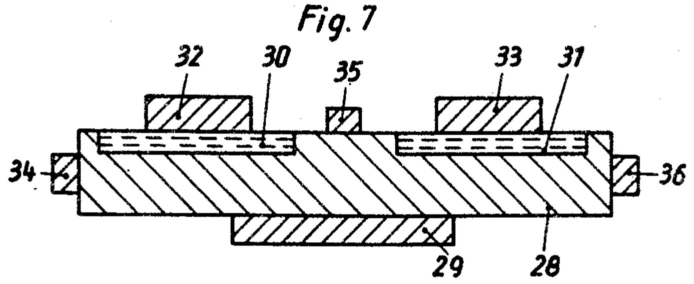
Fig. 7 is a schematic cross sectional view of still another form of the present invention.

A similar relationship is shown in the system illustrated in Fig. 7. Germanium block 28 is provided with carrier electrode 29, transformed zones 30 and 31, main electrodes 32 and 33, as well as auxiliary and control electrodes 34, 35 and 36. In this arrangement, electrode 35 can control both zones at the same time from one transmitter, while a supplementary control is afforded for zones 30 and 31 independent of one another by means of electrodes 34 and 36.

Figure 8:
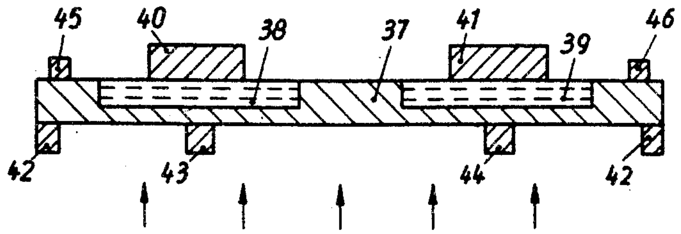
Fig. 8 is a cross sectional view of a further form of the present invention, showing supplementary photoelectric control.

Fig. 8 shows a photoelectrically controlled system, in which germanium block 37 is provided with transformed zones 38 and 39 having main electrodes 40 and 41, respectively, a carrier electrode 42 in the form of a ring, and auxiliary and control electrodes 43, 44, 45 and 46. The arrows shown in this figure indicate the direction of light incidence on the system. In this system, electrodes 43 and 44, for example, may serve as control electrodes for electrical control supplementary to the light control, while electrodes 45 and 46 serve as auxiliary electrodes to influence the characteristic curve of the zones.

It is apparent from the embodiments described above that the number of possible combinations which may be provided in accordance with the invention is very great, and that the capabilities of use of the systems constructed in accordance with the teaching of the invention are practically unlimited.

It will be understood that each of the elements described above, or two or more together, may also find a useful application in other types of electrical conductor systems differing from the types described above.

While the invention has been illustrated and described as embodied in controllable electrically unsymmetrically conductive devices, it is not intended to be limited to the details shown, since various modifications and structural changes may be made without departing in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be secured by Letters Patent is:

1. A controllable electrically unsymmetrically conductive device comprising, in combination, a semi-conductor body composed of a surface region portion adjacent one face of said semi-conductor body and a main body portion constituting the remainder of said semi-conductor body, one of said portions being p-conductive and the other of said portions being n-conductive; a first main electrode on a face of said semi-conductor body spaced from said surface portion of said semi-conductor body and being mounted on said semi-conductor body without any blocking layer between itself and said semi-conductor body; a second main electrode on said surface region portion of said semi-conductor body mounted on the same without any blocking layer between itself and said surface region portion of said semi-conductor body; and at least two additional electrodes of ring shape on the surface of said semi-conductor body located nearer to said surface region portion of said semi-conductor body than said first main electrode.

2. A controllable electrically unsymmetrically conductive device comprising, in combination, a semi-conductor body composed of a surface region portion adjacent one face of said semi-conductor body and a main body portion constituting the remainder of said semi-conductor body, one of said portions being p-conductive and the other of said portions being n-conductive; a first main electrode on a face of said semi-conductor body spaced from said surface region portion of said semi-conductor body and being mounted on said semi-conductor body without any blocking layer between itself and said semi-conductor body; a second main electrode on said surface region portion of said semi-conductor body, mounted on the same without any blocking layer between itself and said surface region portion of said semi-conductor body; and at least two additional electrodes on the surface of said semi-conductor body located nearer to said surface region portion of said semi-conductor body than said first main electrode, said additional electrodes being in the form of annular segments.

3. A controllable electrically unsymmetrically conductive device comprising, in combination, a semi-conductor body composed of a surface region portion adjacent one face of said semi-conductor body and a main body portion constituting the remainder of said semi-conductor body, one of said portions being p-conductive and the other of said portions being n-conductive; a first main electrode on a face of said semi-conductor body spaced from said surface region portion of said semi-conductor body and being mounted on said semi-conductor body without any blocking layer between itself and said semi-conductor body; a second main electrode on said surface region portion of said semi-conductor body, mounted on the same without any blocking layer between itself and said surface region portion of said semi-conductor body; at least two additional electrodes on the surface of said semi-conductor body located nearer to said surface region portion of said semi-conductor body than said first main electrode, said additional electrodes and said surface region portion being arranged about a center symmetrically with respect to each other.

4. A controllable electrically unsymmetrically conductive device comprising, in combination, a semi-conductor body composed of a surface region portion adjacent one face of said semi-conductor body and a main body portion constituting the remainder of said semi-conductor body, one of said portions being p-conductive and the other of said portions being n-conductive, the thickness of said surface region portion being smaller than the extent of said semi-conductor body in the same direction, said surface region portion being composed of at least two laterally spaced zones; a first main electrode on a face of said semi-conductor body spaced from said surface region portion of said semi-conductor body; second main electrodes on said surface region portion of said semi-conductor body, one of said second main electrodes being mounted on each of said laterally spaced zones; and at least two additional electrodes on the surface of said semi-conductor body located nearer to said spaced zones forming said surface region portion of said semi-conductor body than said first main electrode.

5. A controllable electrically unsymmetrically conductive device comprising, in combination, a semi-conductor body composed of a surface region portion adjacent one face of said semi-conductor body and a main body portion constituting the remainder of said semi-conductor body, one of said portions being p-conductive and the other of said portions being n-conductive, the thickness of said surface region portion being smaller than the extent of said semi-conductor body in the same direction, said surface region portion being composed of at least two laterally spaced zones; a first main electrode on a face of said semi-conductor body spaced from said surface region portion of said semi-conductor body and being mounted on said semi-conductor body without any blocking layer between itself and said semi-conductor body; second main electrodes on said surface region portion of said semi-conductor body, one of said second main electrodes being mounted on each of said laterally spaced zones without any blocking layer between itself and said zone; and a plurality of additional electrodes on the surface of said semi-conductor body located nearer to said spaced zones forming said surface region portion of said semi-conductor body than said first main electrode.

6. A controllable electrically unsymmetrically conductive device comprising, in combination a semi-conductor body composed of a surface region portion adjacent one face of said semi-conductor body and a main body portion constituting the remainder of said semi-conductor body, one of said portions being p-conductive and the other of said portions being n-conductive, the thickness of said surface region portion being smaller than the extent of said semi-conductor body in the same direction, said surface region portion being composed of at least two laterally spaced zones, said semi-conductor body being of circular cross section; a first main electrode on a face of said semi-conductor body spaced from said surface region portion of said semi-conductor body and being mounted on said semi-conductor body without any blocking layer between itself and said semi-conductor body; second main electrodes on said surface region portion of said semi-conductor body, one of said second main electrodes being mounted on each of said laterally spaced zones without any blocking layer between itself and said zone; and a plurality of additional electrodes on the surface of said semi-conductor body located nearer to said spaced zones forming said surface region portion of said semi-conductor body than said first main electrode.

7. A controllable electrically unsymmetrically conductive device comprising, in combination a semi-conductor body composed of a surface region portion adjacent one face of said semi-conductor body and a main body portion constituting the remainder of said semi-conductor body, one of said portions being p-conductive and the other of said portions being n-conductive, the thickness of said surface region portion being smaller than the extent of said semi-conductor body in the same direction, said surface region portion being composed of at least two laterally spaced zones, said semi-conductor body being of rectangular cross section; a first main electrode on a face of said semi-conductor body spaced from said surface region portion of said semi-conductor body and being mounted on said semi-conductor body without any blocking layer between itself and said semi-conductor body; second main electrodes on said surface region portion of said semi-conductor body, one of said second main electrodes being mounted on each of said laterally spaced zones without any blocking layer between itself and said zone; and a plurality of additional electrodes on the surface of said semi-conductor body located nearer to said spaced zones forming said surface region portion of said semi-conductor body than said first main electrode.

8. A controllable electrically unsymmetrically conductive device comprising, in combination, a semi-conductor body composed of a surface region portion adjacent one face of said semi-conductor body and a main body portion constituting the remainder of said semi-conductor body, one of said portions being p-conductive and the other of said portions being n-conductive, the thickness of said surface region portion being smaller than the extent of said semi-conductor body in the same direction, said surface region portion being composed of at least two laterally spaced zones, said semi-conductor body being of square cross section; a first main electrode on a face of said semi-conductor body spaced from said surface region portion of said semi-conductor body and being mounted on said semi-conductor body without any blocking layer between itself and said semi-conductor body; second main electrodes on said surface region portion of said semi-conductor body, one of said second main electrodes being mounted on each of said laterally spaced zones without any blocking layer between itself and said zone; and a plurality of additional electrodes on the surface of said semi-conductor body located nearer to said spaced zones forming said surface region portion of said semi-conductor body than said first main electrode.

9. A controllable electrically unsymmetrically conductive device comprising, in combination, a semi-conductor body composed of a surface region portion adjacent one face of said semi-conductor body and a main body portion constituting the remainder of said semi-conductor body, one of said portions being p-conductive and the other of said portions being n-conductive, the thickness of said surface region portion being smaller than the extent of said semi-conductor body in the same direction, said surface region portion being composed of at least two laterally spaced zones; a first main electrode on a face of said semi-conductor body spaced from said surface region portion of said semi-conductor body, said first main electrode being in the form of a cap and being mounted on said semi-conductor body without any blocking layer between itself and said semi-conductor body; second main electrodes on said surface region portion of said semi-conductor body, one of said second main electrodes being mounted on each of said laterally spaced zones without any blocking layer between itself and said zone; and a plurality of additional electrodes on the surface of said semi-conductor body located nearer to said spaced zones forming said surface region portion of said semi-conductor body than said first main electrode.

10. A controllable electrically unsymmetrically conductive device comprising, in combination, a semi-conductor body composed of a surface region portion adjacent one face of said semi-conductor body and a main body portion constituting the remainder of said semi-conductor body, one of said portions being p-conductive and the other of said portions being n-conductive, the thickness of said surface region portion being smaller than the extent of said semi-conductor body in the same direction, said surface region portion being composed of at least two laterally spaced zones; a first main electrode on a face of said semi-conductor body spaced from said surface region portion of said semi-conductor body, said first main electrode being in the form of a ring and being mounted on said semi-conductor body without any blocking layer between itself and said semi-conductor body; second main electrodes on said surface region portion of said semi-conductor body, one of said second main electrodes being mounted on each of said laterally spaced zones without any blocking layer between itself and said zone; and a plurality of additional electrodes on the surface of said semi-conductor body located nearer to said spaced zones forming said surface region portion of said semi-conductor body than said first main electrode.

11. A controllable electrically unsymmetrically conductive device comprising, in combination, a semi-conductor body composed of a surface region portion adjacent one face of said semi-conductor body and a main body portion constituting the remainder of said semi-conductor body, one of said portions being p-conductive and the other of said portions being n-conductive, the thickness of said surface region portion being smaller than the extent of said semi-conductor body in the same direction, said surface region portion being composed of at least two laterally spaced zones; a first main electrode on a face of said semi-conductor body spaced from said surface region portion of said semi-conductor body and being mounted on said semi-conductor body without any blocking layer between itself and said semi-conductor body; second main electrodes on said surface region portion of said semi-conductor body, one of said second main electrodes being mounted on each of said laterally spaced zones without any blocking layer between itself and said zone; and a plurality of additional electrodes of ring shape on the surface of said semi-conductor body located nearer to said spaced zones forming said surface region portion of said semi-conductor body than said first main electrode.

12. A controllable electrically unsymmetrically conductive device comprising, in combination, a semi-conductor body composed of a surface region portion adjacent one face of said semi-conductor body and a main body portion constituting the remainder of said semi-conductor body, one of said portions being p-conductive and the other of said portions being n-conductive, the thickness of said surface region portion being smaller than the extent of said semi-conductor body in the same direction, said surface region portion being composed of at least two laterally spaced zones; a first main electrode on a face of said semi-conductor body spaced from said surface region portion of said semi-conductor body and being mounted on said semi-conductor body without any blocking layer between itself and said semi-conductor body; second main electrodes on said surface region portion of said semi-conductor body, one of said second main electrodes being mounted on each of said laterally spaced zones without any blocking layer between itself and said zone; and a plurality of additional electrodes on the surface of said semi-conductor body located nearer to said spaced zones forming said surface region portion of said semi-conductor body than said first main electrode, said additional electrodes and said surface region portion being arranged about a center symmetrically with respect to each other.

13. A controllable electrically unsymmetrically conductive device comprising, in combination, a semi-conductor body composed of a surface region portion adjacent one face of said semi-conductor body and a main body portion constituting the remainder of said semi-conductor body, one of said portions being p-conductive and the other of said portions being n-conductive, said semi-conductor body having an outer face adapted to be exposed to light rays, the boundaries of the laterally spaced zones of said surface region portion adjacent said main body portion and lying normal to the incidence of light rays being the longest boundaries of said zones and lying closer to said outer face than to said one face of said semi-conductor body; a first main electrode on a face of said semi-conductor body spaced from said surface region portion of said semi-conductor body and being mounted on said semi-conductor body without any blocking layer between itself and said semi-conductor body, said first main electrode being in the form of a grid; second main electrodes on said surface region portion of said semi-conductor body; one of said second main electrodes being mounted on each of said laterally spaced zones without any blocking layer between itself and said zone; and at least two additional electrodes on the surface of said semi-conductor body located nearer to said spaced zones forming said surface region portion of said semi-conductor body than said first main electrode.

14. A controllable electrically unsymmetrically conductive device comprising, in combination, a semi-conductor body composed of a surface region portion adjacent one face of said semi-conductor body and a main body portion constituting the remainder of said semi-conductor body, one of said portions being p-conductive and the other of said portions being n-conductive, the thickness of said surface region portion being smaller than the extent of said semi-conductor body in the same direction, said surface region portion being composed of at least two laterally spaced zones; a first main electrode on a face of said semi-conductor body spaced from said surface region portion of said semi-conductor body and being mounted on said semi-conductor body without any blocking layer between itself and said semi-conductor body; second main electrodes on said surface region portion of said semi-conductor body, one of said second main electrodes being mounted on each of said laterally spaced zones without any blocking layer between itself and said zone; and a plurality of additional electrodes on the surface of said semi-conductor body located nearer to said spaced zones forming said surface region portion of said semi-conductor body than said first main electrode, the minimum distance between said laterally spaced zones of said surface region portion being at least as great as the thickness of said zones.

15. A controllable electrically unsymmetrically conductive device comprising, in combination, a semi-conductor body composed of a surface region portion adjacent one face of said semi-conductor body and a main body portion constituting the remainder of said semi-conductor body, one of said portions being p-conductive and the other of said portions being n-conductive, the thickness of said surface region portion being smaller than the extent of said semi-conductor body in the same direction, said surface region portion being composed of at least two laterally spaced zones; a first main electrode on a face of said semi-conductor body spaced from said surface region portion of said semi-conductor body and being mounted on said semi-conductor body without any blocking layer between itself and said semi-conductor body; second main electrodes on said surface region portion of said semi-conductor body, one of said second main electrodes being mounted on each of said laterally spaced zones without any blocking layer between itself and said zone; and a plurality of additional electrodes on the surface of said semi-conductor body located nearer to said spaced zones forming said surface region portion of said semi-conductor body than said first main electrode, the minimum distance between said additional electrodes and the boundary of each of said zones of said surface region portion being at least as great as the thickness of said zones.

16. A controllable electrically unsymmetrically conductive device comprising, in combination, a semi-conductor body composed of a surface region portion adjacent one face of said semi-conductor body and a main body portion constituting the remainder of said semi-conductor body, one of said portions being p-conductive and the other of said portions being n-conductive, the thickness of said surface region portion being smaller than the extent of said semi-conductor body in the same direction, said surface region portion being composed of at least two laterally spaced zones; a first main electrode on a face of said semi-conductor body spaced from said surface region portion of said semi-conductor body and being mounted on said semi-conductor body without any blocking layer between itself and said semi-conductor body; second main electrodes on said surface region portion of said semi-conductor body, one of said second main electrodes being mounted on each of said laterally spaced zones without any blocking layer between itself and said zone; and a plurality of additional electrodes on the surface of said semi-conductor body located nearer to said spaced zones forming said surface region portion of said semi-conductor body than said first main electrode, the minimum distance between each of said second main electrodes and said additional electrodes being approximately 0.3 mm.

17. A controllable electrically unsymmetrically conductive device comprising, in combination, a semi-conductor body composed of a surface region portion adjacent one face of said semi-conductor body and a main body portion constituting the remainder of said semi-conductor body, one of said portions being p-conductive and the other of said portions being n-conductive, the thickness of said surface region portion being smaller than the extent of said semi-conductor body in the same direction, said surface region portion being composed of at least two laterally spaced zones; a first main electrode on a face of said semi-conductor body spaced from said surface region portion of said semi-conductor body and being mounted on said semi-conductor body without any blocking layer between itself and said semi-conductor body; second main electrodes on said surface region portion of said semi-conductor body, one of said second main electrodes being mounted on each of said laterally spaced zones without any blocking layer between itself and said zone; and a plurality of additional electrodes on the surface of said semi-conductor body located nearer to said spaced zones forming said surface region portion of said semi-conductor body than said first main electrode, the minimum distance between said laterally spaced zones of said surface region portion being greater than twice the minimum distance of one zone from one of said additional electrodes.

18. A controllable electrically unsymmetrically conductive device comprising, in combination, a semi-conductor body composed of a surface region portion adjacent one face of said semi-conductor body and a main body portion constituting the remainder of said semi-conductor body, one of said portions being p-conductive and the other of said portions being n-conductive, the thickness of said surface region portion being smaller than the extent of said semi-conductor body in the same direction, said surface region portion being composed of at least two laterally spaced zones; a first main electrode on a face of said semi-conductor body spaced from said surface region portion of said semi-conductor body and being mounted on said semi-conductor body without any blocking layer between itself and said semi-conductor body; second main electrodes on said surface region portion of said semi-conductor body, one of said second main electrodes being mounted on each of said laterally spaced zones without any blocking layer between itself and said zone; and a plurality of additional electrodes on the surface of said semi-conductor body located nearer to said spaced zones forming said surface region portion of said semi-conductor body than said first main electrode, the minimum distance between said additional electrodes being greater than twice the smallest distance of one of said zones from one of said additional electrodes.

19. A controllable electrically unsymmetrically conductive device comprising, in combination, a semi-conductor body composed of a surface region portion adjacent one face of said semi-conductor body and a main body portion constituting the remainder of said semi-conductor body, one of said portions being p-conductive and the other of said portions being n-conductive, the thickness of said surface region portion being smaller than the extent of said semi-conductor body in the same direction, said surface region portion being composed of at least two laterally spaced zones; a first main electrode on a face of said semi-conductor body spaced from said surface region portion of said semi-conductor body and being mounted on said semi-conductor body without any blocking layer between itself and said semi-conductor body; second main electrodes on said surface region portion of said semi-conductor body, one of said second main electrodes being mounted on each of said laterally spaced zones without any blocking layer between itself and said zone; and a plurality of additional electrodes on the surface of said semi-conductor body located nearer to said spaced zone forming said surface region portion of said semi-conductor body than said first main electrode, said zones of said surface region portion being at the same minimum distance from said additional electrodes.

20. A controllable electrically unsymmetrically conductive device comprising, in combination, a semi-conductor body composed of a surface region portion adjacent one face of said semi-conductor body and a main body portion constituting the remainder of said semi-conductor body, one of said portions being p-conductive and the other of said portions being n-conductive, the thickness of said surface region portion being smaller than the extent of said semi-conductor body in the same direction, said surface region portion being composed of at least two laterally spaced zones; a first main electrode on a face of said semi-conductor body spaced from said surface region portion of said semi-conductor body and being mounted on said semi-conductor body without any blocking layer between itself and said semi-conductor body; second main electrodes on said surface region portion of said semi-conductor body, one of said second main electrodes being mounted on each of said laterally spaced zones without any blocking layer between itself and said zone; and a plurality of additional electrodes on the surface of said semi-conductor body located nearer to said spaced zone forming said surface region portion of said semi-conductor body than said first main electrode, at least one of said additional electrodes lying on a face of said semi-conductor body opposite to that of said one face adjacent said surface region portion.

References Cited in the file of this patent

UNITED STATES PATENTS

| | | |
|---|---|---|
| 2,415,841 | Ohl | Feb. 18, 1947 |
| 2,505,633 | Whaley | Apr. 25, 1950 |
| 2,561,411 | Pfann | July 24, 1951 |
| 2,588,254 | Lark-Horovitz | Mar. 4, 1952 |
| 2,597,028 | Pfann | May 20, 1952 |
| 2,603,692 | Scaff | July 15, 1952 |
| 2,648,805 | Spenke et al. | Aug. 11, 1953 |
| 2,666,814 | Schockley | Jan. 19, 1954 |